United States Patent [19]

Prater

[11] Patent Number: 4,612,457
[45] Date of Patent: Sep. 16, 1986

[54] CURRENT LIMITING OUTPUT BUFFER FOR INTEGRATED CIRCUIT

[75] Inventor: Cordell E. Prater, Johnson City, Tenn.

[73] Assignee: Texas Instruments Incorporated, Dallas, Tex.

[21] Appl. No.: 508,311

[22] Filed: Jun. 27, 1983

[51] Int. Cl.[4] .................. H03K 17/12; H03K 19/094
[52] U.S. Cl. .................................. 307/443; 307/270; 307/448; 307/482; 307/578
[58] Field of Search ............... 307/443, 448, 482, 573, 307/575, 577, 578, 581, 270, 297

[56] References Cited

U.S. PATENT DOCUMENTS

| | | | |
|---|---|---|---|
| 4,096,398 | 6/1978 | Khaitan | 307/270 X |
| 4,129,792 | 12/1978 | Kawagai et al. | 307/270 |
| 4,275,313 | 6/1981 | Boll et al. | 307/270 X |
| 4,322,675 | 3/1982 | Lee et al. | 307/297 X |
| 4,329,600 | 5/1982 | Stewart | 307/270 X |
| 4,395,644 | 7/1983 | Misaizu | 307/270 |

Primary Examiner—Stanley D. Miller
Assistant Examiner—D. R. Hudspeth
Attorney, Agent, or Firm—Melvin Sharp; John A. Haug; James P. McAndrews

[57] ABSTRACT

An output buffer in an MOS integrated circuit is adapted to provide high output currents to meet high performance requirements under varying operating conditions and has voltage responsive MOS means limiting output current under certain operating conditions to assure circuit reliability while permitting restriction of circuit buss capacities within desirable limits.

5 Claims, 1 Drawing Figure

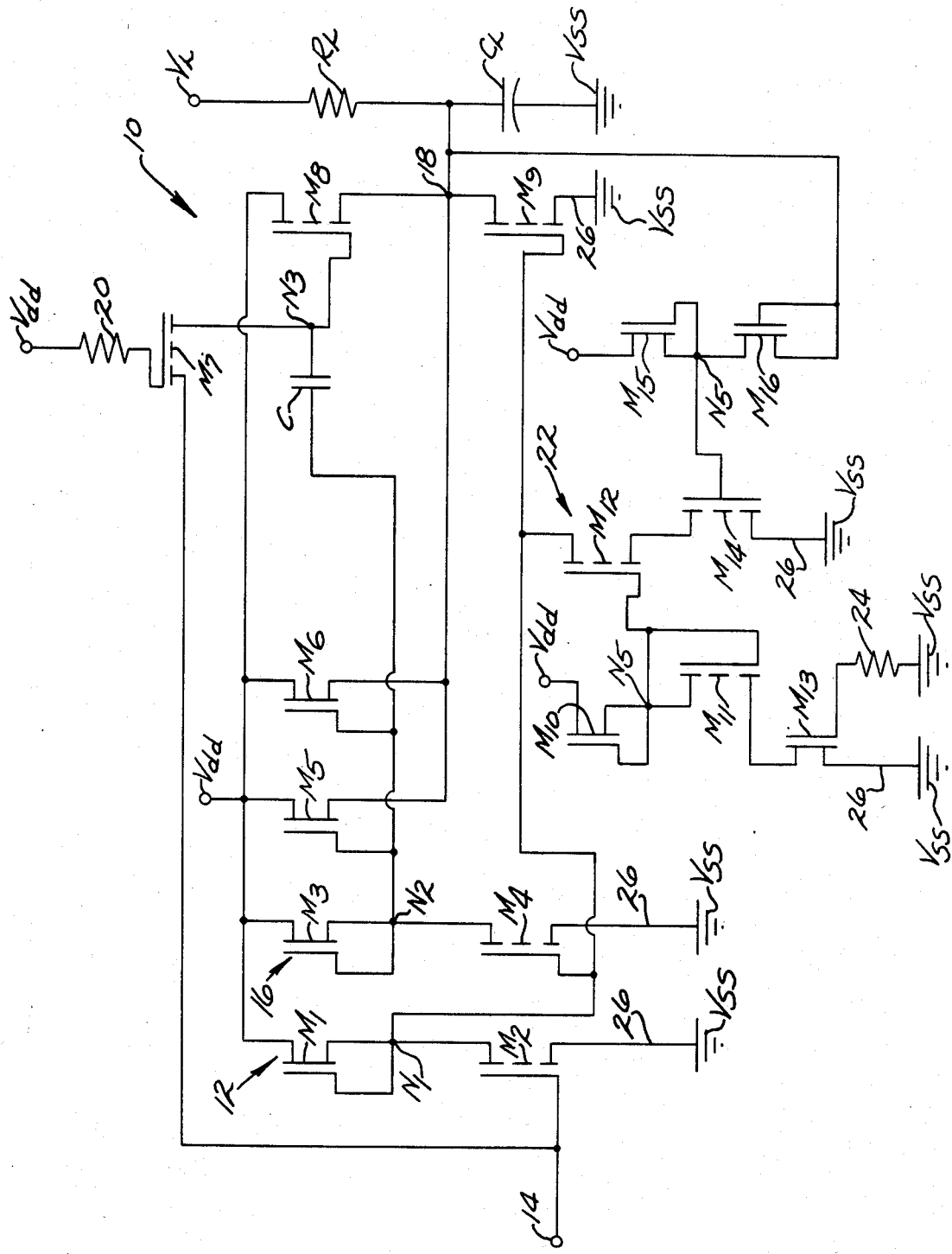

CURRENT LIMITING OUTPUT BUFFER FOR INTEGRATED CIRCUIT

BACKGROUND OF THE INVENTION

The invention relates generally to metal-oxide-semiconductor (MOS) integrated circuits and relates more particularly to an improved MOS output buffer in such a circuit.

Output buffers implemented in bipolar integrated circuit technology have sometimes included current responsive bipolar means and the like for limiting output currents from the buffers for selected purposes. However, MOS devices are characteristically high voltage, low current, voltage-responsive devices and MOS output buffers have not typically had to deal with currents of any substantial magnitude. It is now found that when MOS integrated circuits are adapted to meet certain high performance requirements under widely varying operating conditions in automotive vehicle control applications and the like, MOS transistors capable of providing desired output currents under certain worst case conditions tend to provide excessive currents under other conditions which might exceed the capacities of circuit busses it would be practical to provide on an MOS type of integrated circuit chip. In some applications, the excessive currents can occur briefly during normal operation and can result in poor circuit reliability over a suitable service life. In other cases, the excessive currents can occur through inadvertence by shorting during testing or troubleshooting or the like and can result in catastrophic failure of chip buss means.

SUMMARY OF THE INVENTION

It is an object of this invention to provide a novel and improved MOS integrated circuit having voltage responsive MOS means for limiting current levels in the circuit within selected limits; to provide such MOS integrated circuits in which the current limiting means permit use of compact circuit busses of suitably limited capacity; and to provide a novel and improved MOS output buffer adapted to provide relatively high output currents under varying operating conditions to assure provision of desired current levels under each of those operating conditions, having compact circuit buss means suitably limited in capacity for carrying the desired current levels, and having current limiting means for assuring that buffer currents are maintained within the capacities of the circuit buss means under all of the noted operating conditions.

Briefly described, the novel and improved MOS integrated circuit of this invention comprises MOS circuit means which are capable of providing relatively high current levels under varying operating conditions to assure provision of desired output currents even under selected worst case conditions. The circuit includes buss means which are of selected limited capacity suitable for carrying the desired output currents while also permitting the buss means to be compactly accommodated in the MOS circuit. The circuit also includes voltage-responsive MOS means for limiting the output currents within the capacities of the noted buss means even under selected best case circuit operating conditions.

In a preferred embodiment, the circuit comprises an MOS output buffer having an MOS output transistor capable of meeting current output requirements under varying operating conditions. The buffer further includes voltage-responsive MOS means arranged to be responsive to the gate voltage of the output transistor and to the output voltage of the buffer for limiting output transistor gate voltage to limit current levels in the buffer within the capacity of the buffer circuit busses. Preferably the buffer has pull-down circuit means including push-pull enhancement and depletion means to assure provision of desired holding currents at low output voltage levels. Preferably the circuit also includes bootstrap means to assure provision of output currents at a sufficient rate to meet improved slew rate specifications.

DESCRIPTION OF THE DRAWINGS

Other objects, advantages and details of the novel and improved MOS integrated circuit of this invention appear in the following detailed description of preferred embodiments of the invention, the detailed description referring to the drawings in which:

The FIGURE is a schematic circuit diagram of an MOS output buffer of this invention.

DESCRIPTION OF THE PREFERRED EMBODIMENTS

Referring to the drawing, 10 indicates the novel and improved MOS integrated circuit of this invention which is shown to comprise an output buffer having a first inverter stage 12 incorporating MOS transistors $M_1$ and $M_2$. All P-MOS transistors are illustrated but it should be understood that N-MOS transistors can also be used in a buffer circuit within the scope of this invention. The channels of the transistors $M_1$ and $M_2$ are connected in series between the source and drain supply voltages $V_{ss}$ and $V_{dd}$. In the preferred embodiment as illustrated, transistor $M_1$ is a depletion-type device having its gate connected to its source, and transistor $M_2$ is an enhancement device having its gate connected to the logic input 14 of the buffer. The source of $M_1$ and the drain of $M_2$ are connected in common to form node $N_1$ which is connected to the gates of enhancement-type MOS transistors $M_4$ and $M_9$.

The depletion-type transistor $M_3$ and transistor $M_4$ have their channels connected in series between the source and drain voltages to form a second delay or inverter stage 16 and provide some current gain in the circuit. The transistor $M_3$ has its gate connected to its source and is connected in common to the drain of $M_4$ to form node $N_2$. Node $N_2$ is connected to the gate of enhancement-type transistor $M_5$, to the gate of depletion-type transistor $M_6$ and to one side of capacitor C. The enhancement-type transistors $M_8$ and $M_9$ have their channels connected in series between the source and drain supply voltages in a push-pull configuration to form the output stage of the buffer. The drains of $M_5$ and $M_6$ are connected to the drain supply voltage with their channels in parallel with the channel of transistor $M_8$ and the sources of $M_5$ and $M_6$ are connected in common with the source of transistor $M_8$ to the drain of output transistor $M_9$ to form the output 18 of the buffer 10.

The input 14 of the buffer is also connected to the gate of transistor $M_8$ and to the other side of the capacitor C through the channel of enhancement-type MOS transistor $M_7$ as is indicated at node $N_3$. The gate of transistor $M_7$ is connected to the drain supply voltage $V_{dd}$ and preferably has a resistor 20 in that gate circuit for avoiding problems with static electricity in the buffer.

In accordance with this invention, the output buffer 10 further includes voltage-responsive current-limiting means 22 comprising MOS transistors $M_{10}$–$M_{16}$. The channels of depletion devices $M_{10}$ and $M_{13}$ are connected in series with the channel of enhancement device $M_{11}$ between the source and drain supply voltages as shown; the channels of the two enhancement-type transistors $M_{12}$ and $M_{14}$ are connected in series between the source supply voltage and the gate of transistor $M_9$; and the channels of the two depletion devices $M_{15}$ and $M_{16}$ are connected in series between the drain supply voltage and the output 18 of the buffer. The gate of transistor $M_{10}$ is connected to the source and to the drain of transistor $M_{11}$ to form node $N_4$; the gates of transistors $M_{11}$ and $M_{12}$ are connected in common to node $N_4$ so transistors $M_{11}$ and $M_{12}$ form a current mirror; and the gate of transistor $M_{13}$ is connected to the source supply voltage $V_{ss}$, preferably through a resistor 24 to protect the buffer circuit against static electricity. The gates of transistors $M_{15}$ and $M_{16}$ are also connected to their sources at node $N_5$ which is connected to the gate of switching transistor $M_{14}$. In the current-limiting means 22 as thus described, transistors $M_{13}$ and $M_{16}$ are in the triode region and serve as resistors while transistors $M_{10}$ and $M_{15}$ are saturated and serve as current sources.

As thus far described, the buffer 10 is preferably arranged in an integrated circuit to drive a display or the like represented by the load capacitance $C_L$ and the load impedance $R_L$. In a preferred embodiment of the invention where the buffer is used for driving either an LED or vacuum fluorescent display in an automotive control application for example, $C_L$ typically has a capacitance of about 100 picofarads; the source supply voltage $V_{ss}$ corresponds to the vehicle supply voltage and typically varies from 8 to 18 volts over an ambient temperature range $(t_a)$ from $-30°$ C. to $85°$ C. and is about 9.5 v. at $25°$ C.; and the drain supply voltage $V_{dd}$ corresponds to system ground. In that arrangement, a voltage corresponding generally to $V_{ss}$ applied to the input 14 represents a logic input "1" while an input voltage corresponding to $V_{dd}$ represents the logic input "0". Typically the load voltage $V_L$ is at a level between the source and drain supply voltages.

In one preferred embodiment of this invention, the MOS transistors $M_1$–$M_{16}$ have widths and lengths (W/L) in mils as set forth in Table I below and the capacitor C has a capacitance of 0.9 picofarads:

TABLE I

| Transistor | W/L | Transistor | W/L |
|---|---|---|---|
| $M_1$ | .5/.5 | $M_9$ | 120.0/.3 |
| $M_2$ | 3.5/.3 | $M_{10}$ | .3/.5 |
| $M_3$ | .2/.5 | $M_{11}$ | 2.5/.3 |
| $M_4$ | 1.6/.3 | $M_{12}$ | .6/.3 |
| $M_5$ | 10.0/.3 | $M_{13}$ | .5/.5 |
| $M_6$ | .3/.5 | $M_{14}$ | 2.0/.3 |
| $M_7$ | 1.0/.4 | $M_{15}$ | .3/.5 |
| $M_8$ | 4.0/.3 | $M_{16}$ | .6/.5 |

With those characteristics, the buffer 10 is adapted to achieve the following output specifications:

| | | Min. | Max. |
|---|---|---|---|
| (1) $V_{OH}$ | $I_{OH}$ = 6 milliamps | $V_{ss} - 0.3$ v. | |
| (2) $V_{OH}$ | $I_{OH}$ = 30 milliamps | $V_{ss} - 2.0$ v. | |
| (3) $V_{OL}$ | $I_{OL}$ = 1 microamp | | $V_{dd} + 0.2$ v. |
| (4) $V_{OL}$ | $I_{OL}$ = 500 microamps | | $V_{dd} + 5.0$ v. |
| (5) Slew rate = 5 microseconds. | | | |

That is, where the output voltage is high on the order of 2.0 v. less that $V_{ss}$, the output current will be 30 milliamps or greater while, when the output voltage is low on the order of 5.0 v. greater than $V_{dd}$, the output current is 500 microamps or greater and the buffer 10 is adapted to drive either an LED or a vacuum fluorescent display.

As thus described, the buffer operates in the sink current mode when the input at 14 corresponds to $V_{dd}$. That is, the transistors $M_3$–$M_8$ and capacitor C provide the pull-down circuit to provide the output voltage $V_{dd}$ at the buffer output 18. Transistors $M_9$, $M_5$ and $M_6$ make up a push-pull enhancement and depletion circuit so that $M_6$ provides one microamp output when the output voltage is at $V_{dd}+0.2$ v. as required by specification (2) while transistor $M_5$ provides 500 microamps output when the output voltage corresponds to $V_{dd}+5.0$ v. as required by specification (5). Transistors $M_7$ and $M_8$ and the capacitor C form a bootstrap circuit and transistor $M_8$ provides the transient current to charge the external load capacitor $C_L$ in the allotted time to meet the slew rate specification (5). That is, the bootstrap node $N_3$ is precharged from the input 14 through transistor $M_7$ and, when node $N_2$ goes low toward $V_{dd}$, transistor $M_7$ turns off and allows node $N_3$ to exceed $V_{dd}$ (to $-12$ to $-24$ v.) for keeping transistor $M_8$ on until the output 18 reaches $V_{dd}$.

When the buffer operates in the source current mode with the voltage at 14 and 18 corresponding to $V_{ss}$, the output transistor $M_9$ supplies the source current and, to meet specifications (1) and (2) in the worst case, $M_9$ is proportioned to be a 50 ohm transistor. With a transistor of that size, the worst case current $I_{OL}$ would be 36 milliamps when transistor $M_9$ is saturated. However, an output transistor of such a size under best case conditions (low ambient temperature, high $V_{ss}$, and maximum output voltage) would tend to provide excessive output current on the order of 162 milliamps in $V_{ss}$ circuit busses 26 such as might tend to cause deterioration of busses 26 which are formed of practical cross sectional size on the order of 0.175 square mils or the like. That condition might tend to occur briefly during normal operation of the buffer circuit during an output transistion as when transient current is charging capacitor $C_L$. Under some circumstances, a current of as much as 0.5 amps might tend to occur in a circuit buss 26 in the buffer 10. For example such excessive current conditions might tend to occur if an output is inadvertently shorted to the $V_{dd}$ supply during testing or troubleshooting or the like.

In accordance with this invention however, the current-limiting means 22 serves to limit the gate voltage of output transistor $M_9$ to a safe level under the conditions which might otherwise result in excessive buss currents. Transistor $M_{14}$ is also adapted to turn off the limit circuit means when output voltage approaches $V_{ss}$ and when risk of high currents no longer exists, thereby to permit the full output capability of transistor $M_9$ to be available at the high logic level.

In operation of the buffer 10, a logic input "1" corresponding to the source supply voltage $V_{ss}$ applied to input 14 renders transistor $M_2$ nonconductive so that voltage at node $N_1$ corresponds to $V_{dd}$ and transistors $M_4$ and $M_9$ conduct. When $M_4$ starts conducting, voltage at node $N_2$ goes toward $V_{ss}$ and $M_5$ stops conducting. Transistor $M_6$ will remain on but little current will flow in $M_6$. The input at 14 is also applied to node $N_3$ via transistor $M_7$ which is conducting and transistor $M_8$ therefore tends to be rendered nonconducting. Accordingly, output voltage at 18 corresponds to $V_{ss}$ and output transistor $M_9$ serves as a current source. The voltage at node $N_1$ applied to the gate of output transistor $M_9$ tends to cause the current $I_{M12}$ in transistor $M_{12}$ to equal the current $I_{M1}$ in transistor $M_1$ for limiting the gate voltage on transistor $M_9$ to limit the source current in the circuit busses 26. That is, transistor $M_{10}$ is always conducting so that the gate voltage applied to the current mirror formed by transistors $M_{11}$ and $M_{12}$ normally biases transistor $M_{12}$ to conduct. However, when output voltage at 18 approaches $V_{ss}$, transistors $M_{15}$ and $M_{16}$ are always conducting and a corresponding voltage will appear at node $N_5$ to render transistor $M_{14}$ nonconducting for turning off the current-limiting means 22.

When a logic input "0" corresponding to the drain supply voltage $V_{dd}$ is applied to the input 14, transistor $M_2$ conducts so that voltage at node $N_1$ moves to $V_{ss}$ and transistor $M_4$ and $M_9$ stop conducting. During a brief time after transistor $M_4$ goes off, voltage at node $N_2$ drops from $V_{ss}$ to $V_{dd}$ and charges capacitor C. The voltage $V_{dd}$ at the input 14 is also applied to transistor $M_7$ and $M_7$ stops conducting. At that point, the node $N_3$ is precharged almost to $V_{dd}$ and, while node $N_2$ is dropping toward $V_{dd}$, the capacitor C tries to stay charged and the voltage at node $N_3$ tends to drop below $V_{dd}$ (to $-12$ to $-24$ v.). As a result, the gate voltage on transistor $M_8$ remains high so $M_8$ provides sufficient current to charge capacitor $C_L$ within the desired slew rate specification (needed for example to assure turning off of a vacuum fluorescent display). The drop of node $N_3$ below $V_{dd}$ as described assures that transistor $M_8$ remains on until output voltage at 18 reaches $V_{dd}$. When the input 14 then returns to $V_{ss}$ so that transistor $M_4$ conducts and node $N_2$ also goes to $V_{ss}$, the transistor $M_7$ again conducts for discharging capacitor C and turning off transistor $M_8$. It is noted that because of the nature of the diffusions forming the transistor $M_7$, the charge on capacitor C tends to reduce over a period of time in any event.

It should be understood that although preferred embodiments of the novel and improved MOS output buffer of this invention have been described by way of illustrating the invention, the invention includes all modifications and equivalents of the disclosed embodiments falling within the scope of the appended claims.

I claim:

1. An MOS integrated circuit having circuit means for providing selected current levels at an output of the integrated circuit, the circuit means comprising MOS source current transistor means having transistor drain and source and gate means connected to the integrated circuit output and source supply means respectively, having buss means connected with said circuit means with current capacity relatively less than said selected current levels, and having voltage-responsive current-limiting MOS means for limiting operation of said circuit means for limiting said cirduit current levels within the capacity of said circuit buss means, said current-limiting means comprising means for limiting gate voltage applied to said source current transistor gate means for limiting current provided by said transistor means and having switching means for inactivating the current-limiting means under selected circuit operating conditions for permitting operation of said source current transistor means at full current producing capability under said selected operating conditions.

2. An MOS output buffer having circuit means for providing selected current levels in a buffer circuit and having an output, having buss means connected in the buffer circuit with current capacity relatively less than said selected current levels at least under selected buffer circuit operating conditions, and having voltage-responsive current-limiting MOS means for limiting buffer circuit current levels within the capacity of said circuit buss means under said selected operating conditions, said circuit means comprising MOS output transistor means having gate means and having a drain and source of the transistor respectively connected to the buffer output and source supply voltage means in the buffer circuit, and said current limiting means having switching means for inactivating the current-limiting means under other current operating conditions for permitting operation of said output transistor means at full current-producing capability under said other circuit operating conditions.

3. An MOS output buffer as set forth in claim 2 having pull-down circuit means for providing a low output voltage within a selected range, said pull-down circuit means including push-pull enhancement and depletion transistor means for providing respective holding currents at respective ends of said voltage range.

4. An MOS output buffer as set forth in claim 3 wherein said enhancement circuit means is selected to provide the buffer with a selected holding current at one end of said low voltage range and said depletion circuit means is selected for assuring provision of a holding current at the opposite end of said low voltage range, said enhancement means being rendered inoperative at said opposite ends of the low voltage range for reducing power usage of said buffer.

5. An MOS output buffer as set forth in claim 3 having an output stage including an additional MOS transistor arranged in push-pull configuration with said output transistor means, and having bootstrap means operable for maintaining said additional transistor in a high conducting state during operation of the additional transistor for providing the buffer with an improved slew rate characteristic.

* * * * *